(12) United States Patent
Derks

(10) Patent No.: US 6,661,280 B2
(45) Date of Patent: Dec. 9, 2003

(54) ELECTRONIC FILTER CIRCUIT WITH FEED BACK LOOP

(75) Inventor: Henk Derks, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/047,027

(22) Filed: Jan. 15, 2002

(65) Prior Publication Data

US 2002/0125939 A1 Sep. 12, 2002

(30) Foreign Application Priority Data

Jan. 18, 2001 (EP) .............................. 01200172

(51) Int. Cl.[7] .............................. H03B 1/00; H03K 5/00; H04B 1/00
(52) U.S. Cl. ........................ 327/552; 327/103
(58) Field of Search ................................ 327/103, 552, 327/558, 553

(56) References Cited

U.S. PATENT DOCUMENTS

| | | | | |
|---|---|---|---|---|
| 5,726,600 A | * | 3/1998 | Raghavan et al. | 327/553 |
| 5,742,199 A | * | 4/1998 | Shoji et al. | 327/552 |
| 6,335,655 B1 | * | 1/2002 | Yamamoto | 327/552 |
| 6,404,875 B2 | * | 6/2002 | Malik et al. | 379/211.03 |

* cited by examiner

Primary Examiner—Terry D. Cunningham
Assistant Examiner—Quan Tra
(74) Attorney, Agent, or Firm—Steven R. Biren

(57) ABSTRACT

The invention relates to an electronic filter circuit comprising a controllable transconductance circuit wherein a feedback loop is added to a substantially linear transconductance amplifier G, between two electronic leads having an input portion before the feedback loop and an output portion thereafter.

13 Claims, 3 Drawing Sheets

ELECTRONIC FILTER CIRCUIT WITH FEED BACK LOOP

BACKGROUND OF THE INVENTION

The present invention relates to an electronic filter circuit comprising a controllable transconductance.

A typical application area of such known filters is a Digital Access Arrangement (DAA) for modems. Such an application like some other applications requires on-chip filters which fulfil the conditions of an adjustable cut-off frequency, a low distortion, a small chip area, and a low current consumption. Filters are in such applications required for synthesizing a line-impedance for correct termination of the telephone line and as part of the trans hybrid for sidetone cancellation. Particularly in the latter case, low distortion figures are of prime importance while different country regulations or various telephone line conditions impose requirements with respect to tunability of the filter.

From literature an abundance of filter varieties is known. They can be categorized in time discrete and time continuous realizations. In spite of their accuracy a serious disadvantage of discrete time implementations, like switched capacitor and digital implementations like IIR and FIR structures, is the necessity of additional anti-aliasing filtering which has consequences for chip area.

Time continuous filters which feature frequency adjustability, inherently excluding opamp active filters since the cut-off frequency is fixed, usually suffer from non-linearities due to the applied voltage to current converter with variable transconductance.

BRIEF SUMMARY OF THE INVENTION

It is the object of the present invention to provide a solution overcoming the previously mentioned disadvantages while favourably realising a relatively easily manu-facturable low pass on chip filter within the constraints of the earlier mentioned conditions.

According to the invention, such is favourably realized by an implementation according to the characterising portion of claim 1.

BRIEF DESCRIPTION OF THE SEVERAL VIEWS OF THE DRAWINGS

The invention will now be further elucidated in accordance with a drawing in which.

In the Figures identical reference signs relate to corresponding parts or components. In the following the "_n" addition to a reference symbol shall mean the inverse form of the same current or voltage as the case may be.

DETAILED DESCRIPTION OF THE INVENTION

Figure 1:
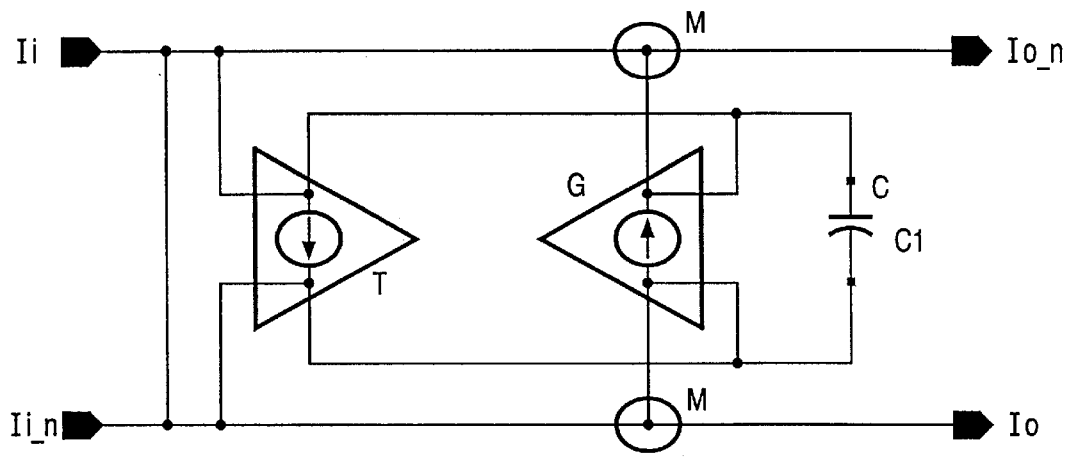
FIG. 1 is a block diagram illustrating the operating principle of the filter according to the invention.

FIG. 1 provides a fully differential symmetrical implementation of the filter circuit according to the invention, comprising a circuit block having signal current in- and output terminals Ii, Ii_n and Io, Io_n respectively. Despite this implementation in the current domain, this is not a prerequisite of the proposed principle.

In this Figure the signal input is on the left and the filtered signal output is on the right.

Four different elements are distinguished in the diagram of FIG. 1:

a current-current conveyor T which acts as an input buffer and which is characterized by a current transfer T:

$$T = \frac{Io^T}{Iin^T} \quad (1)$$

a capacitor C which is in fact the frequency dependent element a linear V to I converter circuit portion G, here alternatively denoted transconductance element G, which converts the voltage across the capacitor to a current.

The transfer is:

$$G = \frac{Io^G}{Vin^G} \quad (2)$$

two current mirrors M to split the converter current in an output current Io and a feedback current.

Because of this feedback current the DC gain of the filter is independent of transfers T and G.

In accordance with the invention it is safely assumed that the input resistance of the V-I converter Ri>>1/GT. Thus the frequency dependent filter transfer H(jω) is written as:

$$H(j\omega) = \frac{Io}{Iin} = \frac{1}{1 + j\omega\frac{C}{GT}} \quad (3)$$

Hence in accordance with the invention the cut-off frequency $f_{-3\ dB}$ is proportional to G and T:

$$f - 3\,dB = \frac{GT}{2\pi C} \quad (4)$$

Figure 2:
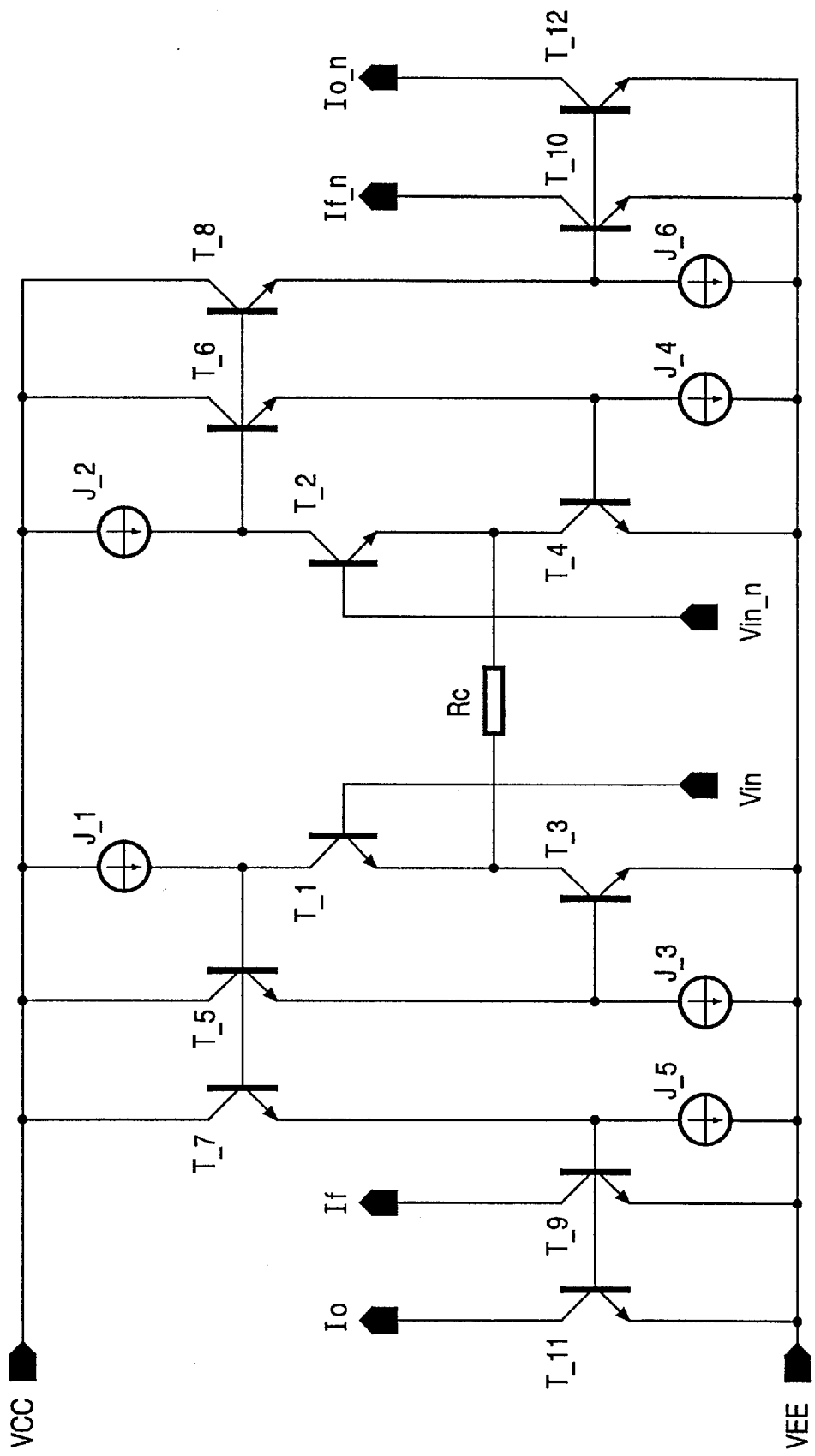
FIG. 2 depicts the circuit implementation of the highly linear transconductance amplifier.

FIG. 2 is a circuit diagram with the measure according to the invention of the filter may consist of a current amplifier with frequency independent transfer, a transconductance amplifier means, e.g. V/I converter, with frequency independent transfer and a capacitor C. Because of a feedback loop in this arrangement the DC gain is independent of the current transfer and of the transfer of the transconductance amplifier. The circuit favourably realises an analog filter with a very low distortion and with a continuously variable cut-off frequency for a symmetrical and linear V-I converter to be applied in the complete filter circuit provided by FIG. 3; and FIG. 2, in configurative sense shows a transistor T_11 having main conduction path between a VEE supply line and current output terminal Io and a control input connected to the control input of a transistor T_9 which has a main conduction path between the VEE line and a feedback output terminal If.

The common control input of transistors T_11 and T_9 is connected to the main connection path of a transistor T_7 connected between a VCC supply line and the VEE supply line. Between the connection with said common control input line of transistors T_11 and T_9, and said VEE supply line, the main conduction path of transistor T_7 is provided with a current source J_5. The control input of transistor T_7 is connected to the control input of a transistor T_5 which again is connected with the main conduction path of a transistor T_1. Transistor T_5 is, like transistor T_7, connected between the VCC supply line and the VEE supply line. The main conduction path of transistor T5 comprises a current source J_3 provided at the downstream side of transistor T5, in the same manner as current source J_5 in the main conduction path of transistor T_7.

Between the current source J_3 and the transistor T_5 the main conduction path thereof is split so as to form a control input for a transistor T_3 provided in the downstream side of the main conduction path of said transistor T_1, connected between the VCC supply line and the VEE supply line. In the upstream side of the main conduction path of transistor T1 between the connection with the control input of transistors T_5 and T_7 and the VCC supply line the conduction path comprises a current source J_1.

Between the transistors T_1 and T_3 the main conduction path is connected to a resistor R_c. The control path of transistor T_1 is formed by a voltage input line in the form of terminal Vin. The remainder of the circuit is a configuration mirrored over the resistance R_c, such that each mirrored component has a reference of which the number part is one (1) higher than the mirrored component reference to the left of the Figure, e.g. J_1 is mirrored as J_2 and T_7 as T_8. With respect to the current output terminal Io, the feedback terminal If and the voltage input terminal Vin, these are referred to on the mirrored side by the addition of _n, indicating the same signal, however having an inverted form, since mirrored.

Functionally, FIG. 2 provides the circuit which converts the voltage across the capacitor into an output and feedback current, being the essence of the filter. A possible implementation of the complete filter on transistor level is given in FIG. 3. A fully differential structure like in the current application offers the advantage of implementation of a common mode loop for DC biasing of the input stage (T_1 and T_2), not shown in the Figure) and suppression of even order harmonics.

In this circuit, by forcing a constant current (J_1/J_2) through the input transistors T_3/T_2 the input voltage on terminals Vin_n and Vin_n, which is identical to the voltage across the filter capacitor is copied across R_c. The input voltage is converted into a current by this resistor.

This conversion current flows through T_3/T_4. Except as part of a feedback loop to realize a constant current through the input transistors, T_3/T_4 are also part of a translinear loop consisting of T_3/T_4, T_5/T_6, T_7/T_8, T_9/T_10 and T_11/T_12. This loop multiplies the conversion current with a factor J_3/J_5 (assuming J_3=J_4 and J_5=J_6).

The transfer G (transconductance) of this V-I converter can be written as:

$$G = \frac{Io}{Vin} = \frac{J3}{J5.Rc} \quad (5)$$

In an alternative embodiment where R_c is an on chip resistor, the conversion inaccuracy due to this resistor is in accordance with the invention compensated by deriving current J_5 from a voltage source and an on-chip resistor and J_3 from the same voltage source and an accurate (external) resistor.

Figure 3:
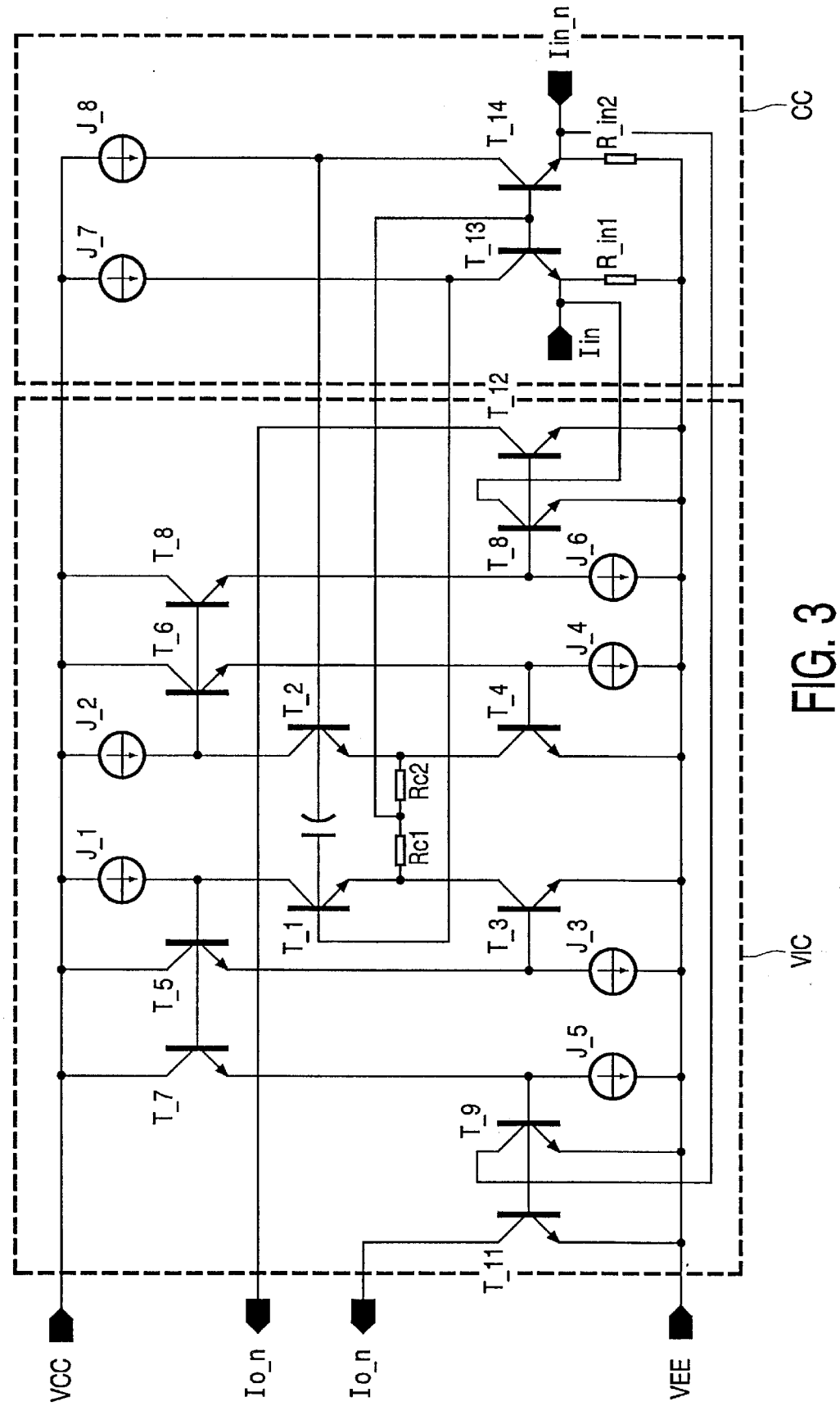
FIG. 3 is a complete filter circuit diagram implementing the principle provided by FIG. 1.

In FIG. 3, in order to realize the filter of FIG. 1, a capacitor C and a current conveyor CC are added to the circuit of FIG. 2. The output and feedback current is already available by copying the converter output current directly, hereby T_9/T_10 and T_11/T_12. Therefore the current mirrors M of FIG. 1 are omitted.

The complete transistor level circuit of FIG. 3 is split up in two parts: a V-I converter part VIC described in the previous paragraph and a current conveyor part CC which acts as input buffer. In the implementation of FIG. 3, in the V_i converter part, relative to the circuit of FIG. 2 the resistance R_c has been replaced by resistors R_c1 and R_c2, the connection between which two resistors is copied to a common control input of transistors T_13 and T_14 of the current conveyor CC. The current conveyor part CC comprises said transistors T_13 and T_14 of which the main conduction paths are each connected between the VCC and VEE lines, wherein the upstream part of the conduction path current sources J_7 and J_8 respectively are provided. Downstream to the transistors T13 and T14 the conduction paths are provided with resistances R_in1 and R_in2 respectively.

The VIC and CC parts are apart from said connection between resistances R_c1 and R_c2 on the one hand and the control input between transistors T_13 and T_14 on the other hand, via a connection of a control input of transistor T_1 to the main conduction path of transistor T_13, while the control input of transistor T_2 is connected to the main conduction path of transistor T_14. In each case the connection to the main conduction path is made between the transistor and the current source, i.e. between T_13 and J_7 and between T_14 and J_8, respectively. In the implementation, the control input of transistors T_1 and T_2 are interconnected by a connection comprising the capacitor C. Further, the main conduction path of the transistors T_9 and T_10 is connected to input terminals Ii_n and Ii respectively, which terminals are connected to the main conduction path of transistors T_14 and T_13 respectively between the transistor and the resistor R_in2 and R_in1 respectively.

Assuming in accordance with the idea underlying the present invention that R_in1/R_in2 are sufficiently large compared to the input resistance of the common base stage the transfer T is approximately equal to one (1), i.e. virtually.

The conversion resistor R_c is split up and in this way a common mode point is created. By connecting this common mode point to the input buffer T_13/T_14 the input stage T_1/T_2 is properly biased. The resulting filter transfer can be written as:

$$H(j\omega) = \frac{Io}{Iin} = \frac{1}{1 + j\omega \frac{J5.RcC}{J3}} \quad (6)$$

Thus, by adding a feedback loop to a very linear voltage to current converter with controllable transconductance a filter is created with a continuously tunable cut-off frequency and very low distortion.

Figure 4:
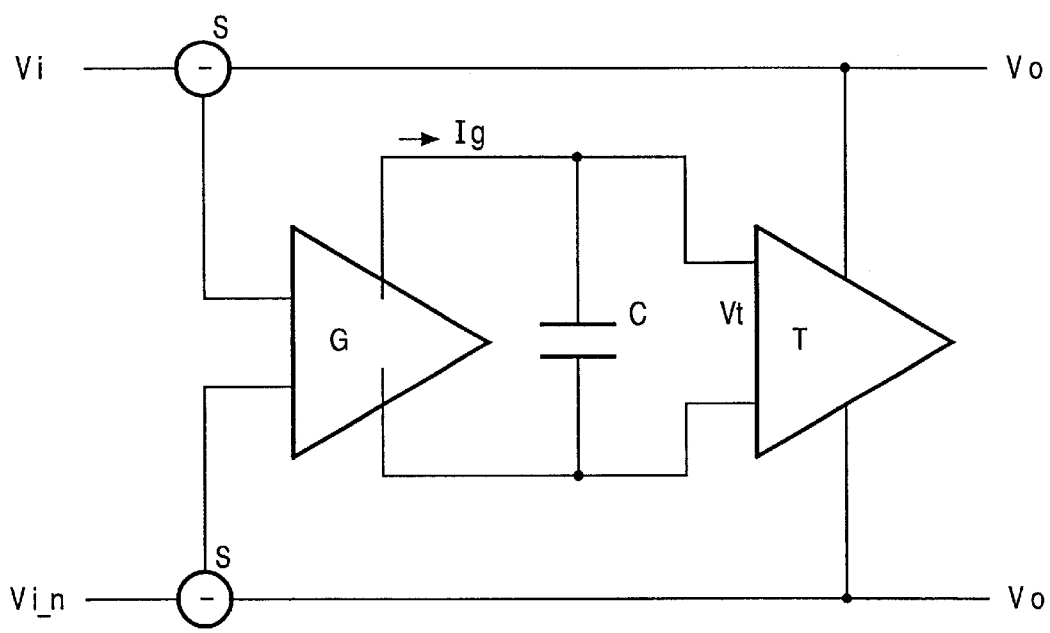
FIG. 4 is a representation in accordance with FIG. 1 for an application of the invented principle in the voltage domain.

FIG. 4, by way of an alternative block diagram illustrates the manner in which the same, above explained principle, in accordance with the invention is implemented in the voltage domain. To the left of the diagram, the voltage supply lines Vi and Vi_n form the input of the circuit, while to the right of the diagram the output lines Vo and Vo_n form the output. The voltage input is, via voltage substractors S lead to a linear voltage V to current I convertor G, which outputs a current via current lines Ig to a voltage-to-voltage conveyor T, which outputs a voltage via a connection to the voltage lines Vo and Vo_n. A capacitor C is incorporated interconnected between the respective leads from the linear V_i convertor G and the voltage-voltage conveyor T, providing the required voltage input for the latter.

It may be derived from this alternative embodiment in accordance with the invention that $$Vin = Vi - Vi\_n \quad (7)$$

$$Vout = Vo - Vo\_n \quad (8)$$

Considering that $$G = \frac{Ig}{Vg} \quad (9)$$

and $$Ig = j\omega Vt \quad (10)$$

while $$T = \frac{Vo}{Vt} \quad (11)$$

it may be rewritten that $$Vo = \frac{GT}{j\omega c} \cdot Vg \quad (12)$$

Since also $$Vg = Vi - Vo \quad (13)$$

it shows that $$Vo = \frac{GT}{j\omega c}(Vi - Vo) \quad (14)$$

which provides that $$H(j\omega) = \frac{Vo}{Vi} = \frac{1}{1 + j\omega \frac{c}{GT}} \quad (15)$$

which demonstrates that the alternative embodiment according to the invention has an identical transfer in the voltage domain compared to the earlier current domain. It will be appreciated by those skilled in the art that the present voltage domain arrangement according to the invention may be readily transformed into circuitry, in analogy to the described transformation in the current-current domain.

The present invention, apart from the above description and all details of the pertaining drawing, further relates to the characterising features provided by the following claims.

What is claimed is:

1. Electronic circuit comprising a feedback loop added to a substantially linear transconductance amplifier, between two electronic leads having an input portion before the feedback loop and an output portion thereafter, wherein the feedback loop utilizes said substantially linear transconductance amplifier and comprises a frequency dependent element, a current to current conveyor part connected to each lead, and two current splitter elements, each connecting a lead to said transconductance amplifier, arranged for converting a voltage across said frequency dependent element to a current, and connecting to said current-to-current conveyor part.

2. Electronic circuit comprising a feedback loop added to a substantially linear transconductance amplifier, between two electronic leads having an input portion before the feedback loop and an output portion thereafter, characterised in that the feedback loop utilizes said substantially linear transconductance amplifier and comprises a frequency dependent element, a voltage to voltage conveyor part connected to each lead and two voltage subtractor elements, each connecting a lead to said transconductance amplifier, arranged for converting a current across said frequency dependent element to a voltage, and connecting to said voltage-to-voltage conveyor part.

3. Electronic circuit according to claim 1, characterised in that the circuit is configured at least virtually entirely symmetrical.

4. Electronic circuit according to claim 1, characterised in that the frequency dependent element is embodied by a capacitor.

5. Electronic circuit according to claim 1, characterised in that said substantially linear transconductance amplifier is controllable by means of an integrated translinear loop.

6. Electronic circuit according to claim 1, characterised in that the electronic circuit feeds a part of the electronic leads signal to the leads.

7. Electronic circuit according to claim 1, in which said two current splitter elements are each embodied by a current mirror.

8. Semiconductor chip comprising a feedback loop added to a substantially linear transconductance amplifier, between two electronic leads having an input portion before the feedback loop and an output portion thereafter, characterised in that the feedback loop utilizes said substantially linear transconductance amplifier, and comprises a frequency dependent element, a current to current conveyor part connected to each lead, and two current splitter elements, each connecting a lead to said transconductance amplifier, arranged for converting a voltage across said frequency dependent element to a current, and connecting to said current-to-current conveyor part, wherein the chip comprises a common mode loop, biasing an input stage to an electronic circuit and/or suppression of even order harmonics.

9. Electronic circuit according to claim 2, characterised in that the circuit is configured at least virtually entirely symmetrical.

10. Electronic circuit according to claim 2, characterised in that the frequency dependent element is embodied by a capacitor.

11. Electronic circuit according to claim 2, characterised in that said substantially linear transconductance amplifier is controllable by means of an integrated translinear loop.

12. Electronic circuit according to claim 2, characterised in that the electronic circuit feeds a part of the electronic leads signal to the leads.

13. A semiconductor chip comprising a feedback loop added to a substantially linear transconductance amplifier, between two electronic leads having an input portion before the feedback loop and an output portion thereafter, characterised in that the feedback loop utilizes said substantially linear transconductance amplifier and comprises a frequency dependent element, a voltage to voltage conveyor part connected to each lead, and two voltage subtractor elements, each connecting a lead to said transconductance amplifier, arranged for converting a current across said frequency dependent element to a voltage, and connecting to said voltage-to-voltage conveyor part, wherein the chip comprises a common mode loop, biasing an input stage to an electronic circuit and/or suppression of even order harmonics.

* * * * *